United States Patent [19]

Noerpel

[11] 4,419,671

[45] Dec. 6, 1983

[54] SMALL DUAL FREQUENCY BAND HYBRID MODE FEED

[75] Inventor: Anthony R. Noerpel, Long Branch, N.J.

[73] Assignee: Bell Telephone Laboratories, Incorporated, Murray Hill, N.J.

[21] Appl. No.: 315,619

[22] Filed: Oct. 28, 1981

[51] Int. Cl.[3] .............................................. H10Q 13/02

[52] U.S. Cl. .................................. 343/786; 333/21 R

[58] Field of Search ........................ 343/783, 786, 909; 333/21 R, 239, 241, 242

[56] References Cited

U.S. PATENT DOCUMENTS

| | | | |
|---|---|---|---|
| 3,016,503 | 1/1962 | Pierce | 333/242 |
| 3,121,206 | 2/1964 | Mandel | 333/242 |
| 3,148,370 | 9/1964 | Bowman | 343/756 |
| 3,289,121 | 11/1966 | Comte | 333/242 |
| 3,573,681 | 4/1971 | Miller | 333/242 |
| 3,601,720 | 8/1971 | Nakahara et al. | 333/242 |
| 3,605,101 | 9/1971 | Kolettis et al. | 343/783 |
| 3,618,106 | 11/1971 | Bryant | 343/772 |
| 4,021,814 | 5/1977 | Kerr et al. | 343/786 |
| 4,040,061 | 8/1977 | Roberts et al. | 343/786 |
| 4,231,042 | 10/1980 | Turrin | 343/786 |
| 4,246,584 | 1/1981 | Noerpel | 343/786 |

OTHER PUBLICATIONS

Kerzhentseva; Conversion of Wave Modes in a Waveguide, Radio Eng. & Elec. Physics, vol. 16, No. I, Jan. 1971, pp. 24–30.

Dragone; Characteristics of a Broadband Microwave Corrugated feed; BSTJ, vol. 56, No. 6, Jul.-Aug., 1977; pp. 869–888.

Carpenter; A Dual-Band Corrugated Feed Horn; AP-S, Int. Symposium, Quebec, Canada, vol. I, 1980, pp. 213–216.

*Primary Examiner*—Eli Lieberman

*Attorney, Agent, or Firm*—Erwin W. Pfeifle

[57] ABSTRACT

The present invention relates to a small hybrid mode feed for dual frequency band use. In the present feed, a helically wound wire structure (10) is bonded to the inner surface of a hollow conducting waveguide structure (12) by a layer (14) of low-loss dielectric material having a predetermined thickness to permit a first frequency band to propagate. Embedded in the dielectric layer between the helically wound wire structure and the inner wall of the waveguide is a periodic tuned grid structure (16) disposed at a predetermined depth from the helical wire structure to permit a second frequency band to propagate. The periodic tuned grid structure can comprise, for example, a Jerusalem Cross grid arrangement.

3 Claims, 4 Drawing Figures

SMALL DUAL FREQUENCY BAND HYBRID MODE FEED

BACKGROUND OF THE INVENTION

1. Field of the Invention

The present invention relates to a small dual frequency band hybrid mode feed and, more particularly, to a small dual frequency band hybrid mode feed comprising a helical winding of wire supported on the inside of a hollow conical waveguide structure by a layer of dielectric material with a periodic tuned grid structure embedded in the dielectric layer.

2. Description of the Prior Art

Typical communication systems operate with two separated frequency bands of interest for transmit and receive. For radio systems, feedhorns are used to launch the electromagnetic energy for reception by a distant receiver. The corrugated horn antenna is a well known device which provides a circularly symmetrical radiation pattern which is essentially free of primary sidelobes. The corrugated horn antenna is, however, generally bandwidth limited and various arrangements have been conceived to broaden the bandwidth of the corrugated horn antenna. For example, in U.S. Pat. No. 4,040,061 issued to C. G. Roberts et al on Aug. 2, 1977, a horn antenna with broadband corrugations is provided by the addition of a dissiptative $TM_{11}$ mode suppressor means disposed in the input waveguide feed to the horn. In another arrangement disclosed in U.S. Pat. No. 4,021,814 issued to J. L. Kerr et al on May 3, 1977 a broadband corrugated horn antenna is provided by providing a corrugated ridge pattern with gaps therebetween in which the width of the gaps is greater than the width of the ridges.

Hybrid mode feeds have also been designed which have the advantage over standard $TE_{10}$-rectangular and $TE_{11}$-circular mode feeds of radiating a symmetrical pattern about their axis so that the main beam contours would be identical for both polarizations. Typical feeds with mode converters included therein are shown in, for example, U.S. Pat. No. 3,618,106 issued to G. H. Bryant on Nov. 2, 1971 wherein the $TE_{11}$-circular mode is converted to the $HE_{11}$-circular mode by the use of corrugations which decrease in depth in the direction of propagation. Another example of such mode conversion is disclosed in the article "Characteristics of a Broadband Microwave Corrugated Feed: A Comparison Between Theory and Experiment" by C. Dragone in BSTJ, Vol. 56, No. 6, July-August 1977 at pp. 869–888.

Hybrid mode feeds which convert the $TE_{11}$-circular mode the the $HE_{11}$-circular mode using helically wound wire structures of various configurations that are bonded to the interior surface of a waveguide are disclosed in U.S. Pat. Nos. 4,231,042 issued to R. H. Turrin on Oct. 28, 1980 and 4,246,584 issued to A. R. Noerpel on Jan. 20, 1981.

The problem remaining in the prior art is to provide a feed which will function for two arbitrarily separated frequency bands, be capable of being built with thin walls and a small aperture to allow for use as an array element of a closely spaced phased array and also radiate a far field power pattern with main lobe contours identical for two orthogonal polarizations.

SUMMARY OF THE INVENTION

The foregoing problems in the prior art have been solved in accordance with the present invention which relates to a small dual frequency band hybrid mode feed and, more particularly, to a small dual frequency band hybrid mode feed comprising a helical winding of wire supported on the inside of a hollow conical waveguide structure by a layer of dielectric material with a periodic tuned grid structure embedded in the dielectric layer.

It is an aspect of the present invention to provide a small hybrid mode feedhorn comprising a hollow waveguide body, a helically wound wire structure bonded to the inner surface of the waveguide body with a dielectric layer comprising a predetermined thickness to permit a predetermined mode to propagate at a first frequency band, and a periodic tuned grid structure embedded in the dielectric layer at a predetermined depth from the helical wire structure to permit the predetermined mode to propagate at a second frequency band.

It is a further aspect of the present invention to provide a small dual frequency band hybrid mode feed which can be constructed using thin walls and a small aperture to permit applications of such feed in closely spaced feed arrays, and can radiate a polarization independent pattern at two different frequency bands.

Other and further aspects of the present invention will become apparent during the course of the following description and by reference to the accompanying drawings.

BRIEF DESCRIPTION OF THE DRAWINGS

Referring now to the drawings, in which like numerals represent like parts in the several views.

DETAILED DESCRIPTION

Many radio communication systems have two separated frequency bands of interest for transmit and receive, and in accordance with the present invention a waveguide or feedhorn is provided which has two narrow operating frequency bands rather than one broadband of operation encompassing both bands. In accordance with the present invention, operation of a waveguide or a feedhorn in two narrow frequency bands has been accomplished by the inclusion of a periodic tuned grid structure in a waveguide or feedhorn to provide the necessary series and parallel resonance.

Figure 1:
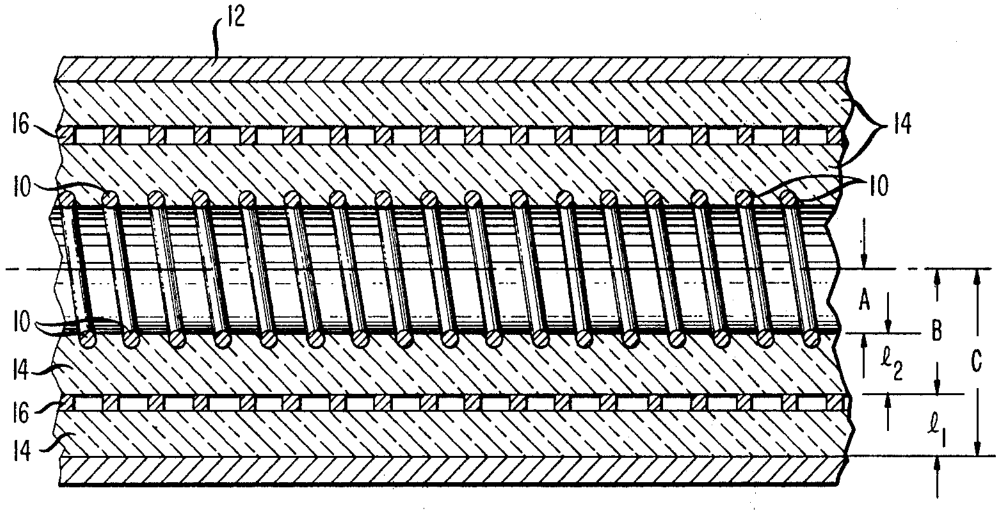
FIG. 1 is a view in cross-section of a waveguide section for propagating a hybrid mode in accordance with the present invention which includes a helically wound wire structure and a periodic tuned grid structure.

FIG. 1 shows a cross-sectional view of a waveguide for propagating a hybrid mode in two narrow frequency bands in accordance with the present invention. There, a helically wound wire structure 10 is bonded to the inner wall of a conductive hollow waveguide body 12, having a radius C, by a dielectric layer 14 in which is embedded a periodic tuned grid structure 16 at a radial distance $l_2$ from the helical wire structure 10 and a radial distance $l_1$ from the inner wall of waveguide body 12. A typical arrangement which can be used in the periodic tuned grid structure 16 is the well-known Jerusalem Cross grid configuration shown in FIG. 2. The Jerusalem Cross grid is provided by forming the hatched configuration 20 with a metallic conductive material on a dielectric substrate 22 by any well-known process. The dielectric substrate and Jerusalem Cross grid configuration thereon are then embedded in dielectric layer 14 as shown in FIG. 1.

Figure 2:
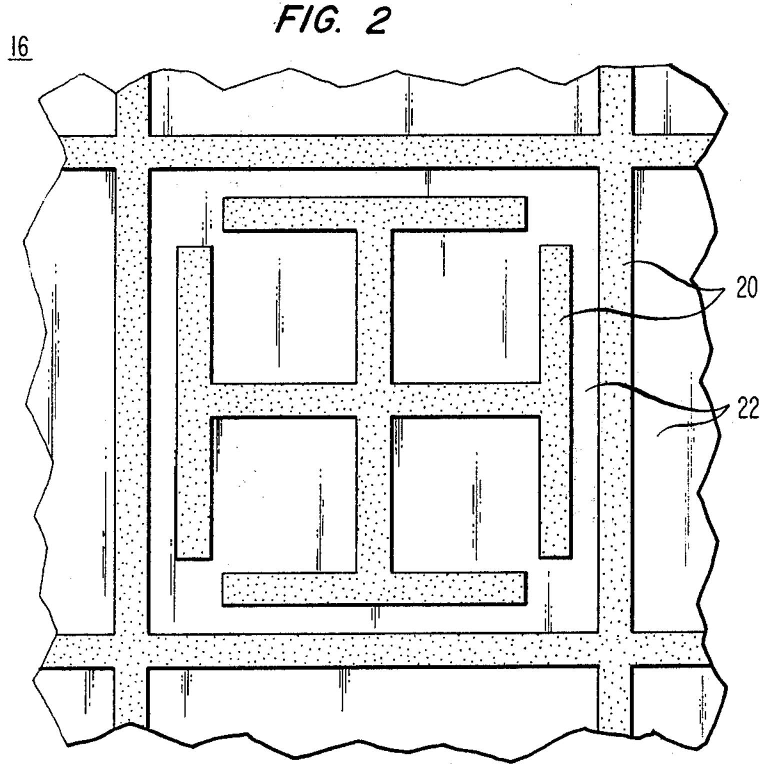
FIG. 2 illustrates an exemplary periodic tuned grid arrangement known as a Jerusalem Cross Grid which can be used in the arrangement of FIG. 1.

For an analysis of the arrangement of FIGS. 1 and 2, hybrid mode cylindrical waveguide structures are characterized by an anisotropic transverse wall impedance looking in the radial direction such that:

$$\left.\begin{array}{l} E_z/H_\phi = -Z_w \\ \text{and} \\ E_\phi = 0 \end{array}\right\} p = a \qquad (1)$$

where $Z_w$ is the longitudinal component of wall impedance and where the latter boundary condition is prescribed by the presence of the helical wires. The radius, a, is the location of the helical winding 10, b is the location of the Jerusalem Cross grid 16, and c is the location of an electrical conductor or waveguide body 12.

When $Z_w$ is large, i.e., $H_{\phi p=a}=0$, the requirements for $HE_{11}$-circular hybrid mode propagation is satisfied. Specifically, these boundary conditions are met by the total field quantities and not necessarily by individual modes including surface wave modes and evanescent modes.

Figure 4:
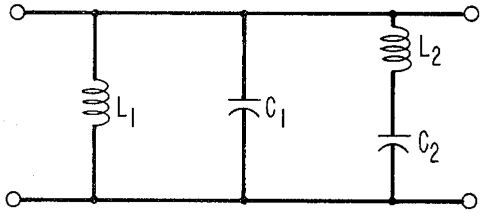
FIG. 4 shows a network equivalent for a Jerusalem Cross grid assuming normal incidence.

FIG. 4 illustrates the transmission line network representative of the Jerusalem Cross, and from FIG. 4 it can be seen that the Jerusalem Cross has a complex impedance represented by $$Z_{jc} = \frac{(1 - \omega^2 L_2 C_2) j\omega L_1}{(1 - \omega^2 L_2 C_2)(1 - \omega^2 L_1 C_2) - \omega^2 C_2 L_1} \qquad (2)$$

which has a zero at $\omega = 1/\sqrt{L_2C_2}$. At this frequency, $f_2$, the grid 16 looks like a short circuit. If thickness $l_2 = \lambda_0/4\sqrt{\epsilon_r}$ for this frequency, then the boundary conditions will be satisfied for $HE_{11}$-circular mode propagation in a small band centered at frequency $f_2$. In addition the values of $L_1$ and $C_1$ can be chosen so that at some frequency $f_1$, $Z_{jc}$ goes to infinity. If at this frequency the combined thickness $l_1 + l_2 = \lambda_0/4\sqrt{\epsilon_r}$, then the boundary conditions for $HE_{11}$-circular mode propagation will also be satisfied for a small band centered at $f_1$.

Figure 3:
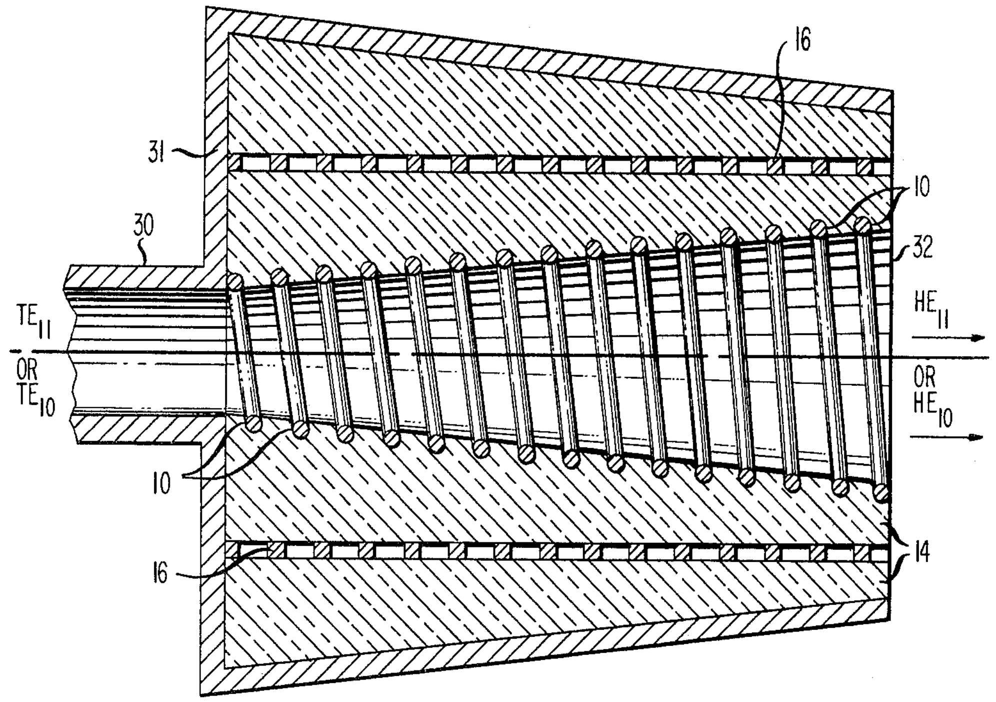
FIG. 3 is a view in cross-section of a small aperture hybrid mode feed in accordance with the present invention.

A feedhorn arranged in accordance with the present invention is shown in FIG. 3. There, the $TE_{10}$-rectangular mode for a rectangular waveguide or the $TE_{11}$-circular mode for a circular waveguide enters the feedhorn area via a smooth-walled cylindrical waveguide 30. Waveguide 30 is expanded in cross-section at a step 31. Within the expanded section of waveguide 30, a dual-band mode conversion and hybrid mode feedhorn is provided. More particularly, in the expanded waveguide section, an outwardly tapered helically wound wire structure 10 extends from the narrow aperture of waveguide 30 at step 31 to the aperture 32 of the feedhorn and is bonded to the inner wall of the expanded section of waveguide 30 by a layer 14 of dielectric material. Embedded in the dielectric layer 14 is an outwardly tapered periodic tuned grid structure 16 which decreases in distance from both the inner wall of the expanded waveguide section and the helically wound wire structure 10 in the direction of wave propagation from step 31 to aperture 32.

From articles as, for example, "Reflection, Transmission and Mode Conversion in a Corrugated Feed" by C. Dragone in BSTJ, Vol. 56, No. 6, July-August, 1977 at pp. 835–867 and "Characteristics of a Broadband Microwave Corrugated Feed: A Comparison Between Theory and Experiment" by C. Dragone in BSTJ, Vol. 56, No. 6, July-August, 1977 at pp. 869–888 it has been found that for a waveguide with finite surface impedances, the fundamental $HE_{11}$-circular mode approaches, under certain conditions the behavior that the field essentially vanishes at the boundary and the field is essentially polarized in one direction. Because of these properties, such a mode is useful for long distance communications since it is little affected by wall imperfections or wall losses and provides an ideal illumination for a feed for reflector antennas. In general, it is difficult to excite the $HE_{11}$-circular mode in a corrugated feed since, at the input, the feed is usually excited by the $TE_{11}$-circular mode of a circular waveguide with smooth metal walls. For the $TE_{11}$-circular mode, the transverse wavenumber, $\sigma$, is related to the waveguide radius a by $\sigma a = 1.84184$. At the feed aperture, however, for the desired $HE_{11}$ mode, $\sigma a \simeq 2.4048$. Thus the mode parameter $u = \sigma a$ must increase from 1.84184 to about 2.404 as the mode propagates from the input of the feed to the aperture.

In a corrugated waveguide, u is known to be a decreasing function of the corrugations depth d. Therefore, in order for u to increase, d must decrease in the direction of propagation. Therefore, in the arrangement of FIG. 3, the $TE_{10}$-rectangular mode is converted to the $HE_{10}$-rectangular mode, or the $TE_{11}$-circular mode is converted to the $HE_{11}$-circular mode in the first frequency band of interest and in the second frequency band of interest by the gradual decrease of the distance from nominally $\lambda/2$ to $\lambda/4$ between the tapered helically wound wire structure 10 and the periodic tuned grid structure 16 and the inner wall of the expanded waveguide section, respectively.

Therefore, in accordance with the present invention for a waveguide or feedhorn, the windings of the helix force the tangential electric field parallel to the windings to go to zero at the helix surface, while the depth of the dielectric layer in conjunction with the electrical properties of the materials comprising the layer and its substrate forces the magnetic field parallel to the windings to zero at the helix surface. The deployment of a periodic tuned grid allows these conditions to exist at two separate frequency bands. It is to be understood that the present concept of using the periodic tuned grid embedded in the dielectric layer of a helical feedhorn can be used in applications where corrugated surfaces have previously been used. An example is as a 4-port combining network, for example, at 4 and 6 GHz at two polarizations.

What is claimed is:

1. A dual frequency band, hybrid mode feed comprising:

a hollow waveguide body (12) comprising an inner surface; and a helically wound wire structure (10) bonded to the inner surface of the waveguide body with a dielectric layer (14) having a predetermined thickness which permits a predetermined mode to propagate at a first frequency band; and a periodic tuned grid structure (16) which is embedded in the dielectric layer between the helically wound wire structure and the inner surface of the waveguide body at a predetermined depth from the helically wound wire structure to permit said predetermined mode to propagate at a second frequency band.

2. A dual frequency band hybrid mode feed according to claim 1 wherein the feed further comprises an entrance port at a first end thereof and an aperture (32) at a second end thereof; and the helically would wire structure comprises a configuration which, in the direction from the entrance port to the aperture of the feed gradually tapers outwards towards the inner surface of the hollow waveguide body for converting a $TE_{10}$-rectangular mode or a $TE_{11}$-circular mode in the first frequency band at said entrance port to a $HE_{10}$-rectangular mode or a $HE_{11}$-circular mode, respectively, at the aperture of the feed; and the periodic tuned grid structure comprises a configuration which, in the direction from the entrance port to the aperture of the feed, gradually approaches the helically wound wire structure for converting a $TE_{10}$-rectangular mode or a $TE_{11}$-circular mode in the second frequency band at said entrance port to a $HE_{10}$-rectangular mode or a $HE_{11}$-circular mode, respectively, at the aperture of the feed.

3. A dual frequency band hybrid mode feed according to claim 1 or 2 wherein the periodic tuned grid structure comprises a Jerusalem Cross grid arrangement formed on a dielectric substrate.

* * * * *